US005079387A

United States Patent [19]

Weaver et al.

[11] Patent Number: 5,079,387

[45] Date of Patent: Jan. 7, 1992

[54] ELECTRICAL COMPONENT WITH ENCLOSURE AND METHOD OF MANUFACTURE THEREOF

[75] Inventors: Robert F. Weaver, Brownsburg; Benjamin F. Chestnut, Indianapolis, both of Ind.

[73] Assignee: Emerson Electric Co., St. Louis, Mo.

[21] Appl. No.: 472,702

[22] Filed: Jan. 31, 1990

[51] Int. Cl.[5] .............. H05K 5/02

[52] U.S. Cl. .............. 174/17 VA; 228/110; 220/367; 264/23

[58] Field of Search .............. 174/17 VA, 52.1, 52.5; 357/84; 228/110, 111; 264/23; 156/73.1

[56] References Cited

U.S. PATENT DOCUMENTS 4,375,578 3/1983 Mitchell et al. .............. 357/84 X
4,901,135 2/1990 Costigan .............. 357/84 X
4,975,545 12/1990 China et al. .............. 174/52.1

*Primary Examiner*—Leo P. Picard
*Assistant Examiner*—David A. Tone
*Attorney, Agent, or Firm*—Robert F. Meyer

[57] ABSTRACT

A relay is enclosed between a cup-shaped cover and a plate. The cover includes a bottom and side walls. The interior circumference of the distal end of the side walls is notched a rim. A first flange is formed on the plate a distance from the edge of the plate that is smaller than the thickness of the rim. The height of the first flange is less than the length of the rim. A second flange extends from the first flange generally perpendicularly to the plate, sloping away from the outer circumference of the plate. As the cover is moved toward the plate, the second flange engages the inner surface of the wall and forces it outwards moving the rim toward the first flange. When the rim and first flange meet, ultrasound is applied. The rim and first flange melt at their point of contact and air is compressed in a pocket formed by the wall, rim, and second flange as the rim moves toward the plate, forcing the flash from the enclosure. Any flash which is not forced from the enclosure is trapped in the pocket. After installation of the assembly, a post may be broken away from the cover to expose a vent hole.

18 Claims, 5 Drawing Sheets

FIG. 4A
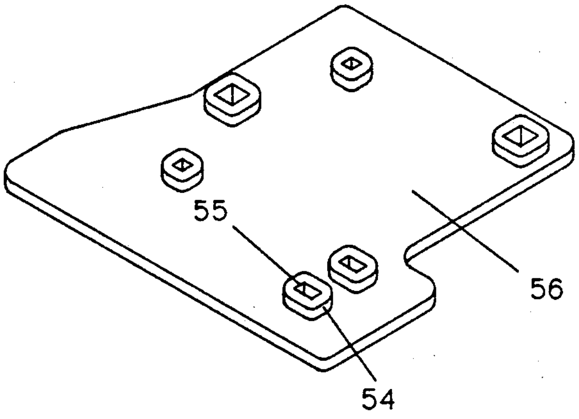
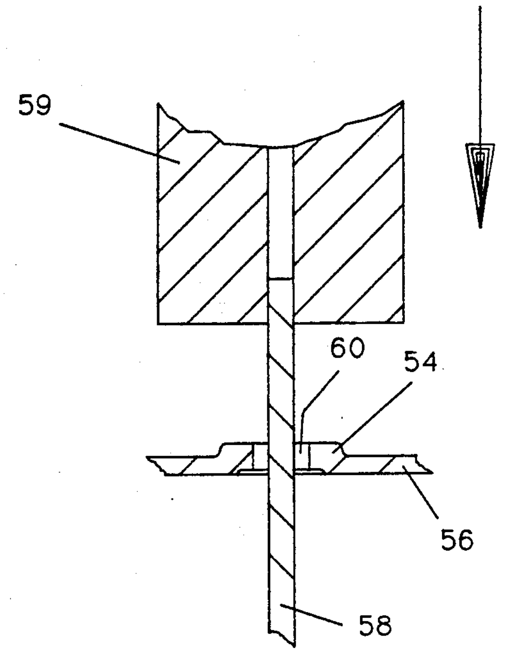
FIG. 4B
FIG. 4C
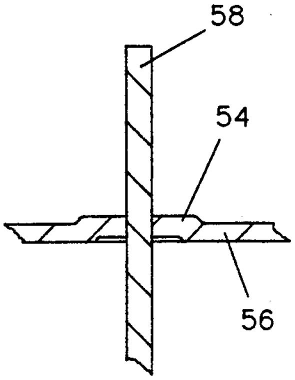

ELECTRICAL COMPONENT WITH ENCLOSURE AND METHOD OF MANUFACTURE THEREOF

BACKGROUND OF THE INVENTION

1. Field of the Invention

The invention in general relates to the field of electrical components that are part of larger electromechanical assemblies, and in particular it relates to such a component having an enclosure that protects it during the manufacturing process.

2. Description of the Prior Art

Electrical components, such as relays, that are used in larger electromechanical assemblies, such as in automobiles, are widely known. It is common to package such components to make them easier to assemble and to protect them during manufacture. See, for example, U.S. Pat. No. 4,801,908 issued on an invention of Robert F. Weaver. In this disclosure the component is packaged in an enclosure comprising a cup-shaped cover and a plate which are snapped together. When such components are to be mounted on a circuit board with other components, during the manufacturing process the circuit board may be dipped several times in liquids, such as flux, solder, or a conformal coating. In such instances, the packages of the prior art may permit fluid to leak through small gaps between the plate and cover or about electrical terminals that protrude from the enclosure. Further, the conformal coating will seal all gaps and openings in the package when it dries, thereby preventing potentially destructive gases that may be produced during operation from being vented. It is then necessary to provide a venting means after the assembly has been accomplished.

SUMMARY OF THE INVENTION

It is an object of the invention to provide an electrical assembly and method of manufacturing such an assembly that overcomes one or more disadvantages of the prior art.

It is another object of the invention to provide the above object in an electrical assembly and method that lends itself to automated manufacture.

It is a further object of the invention to provide one or more of the above objects in an electrical assembly and method of manufacture that permits the assembly to be totally sealed during manufacture and yet ensures that it is vented upon installation in the larger assembly of which it is a part.

It is still another object of the invention to provide an electrical assembly and method of manufacture thereof that compensates for tolerance variations of the various subparts and warpage of the parts that commonly occur during manufacture.

It is a further object of the invention to provide one or more of the above objects in an electrical assembly and method of manufacture thereof that provides a seal by methods such as ultrasonic welding without the addition of other materials such as glues, epoxies, and sealers and at the same time encourages flash produced in the ultrasonic welding process to be directed external of the enclosure or to other places that will not interfere with the working of the electrical component.

It is another object of the invention to provide one or more of the above objects in an electrical assembly and method of manufacture thereof that seals the enclosure about electrical terminals that may protrude from the enclosure.

The invention provides an electrical assembly intended to be a part of a larger system, such as an automobile, the assembly comprising an electrical component having one or more electrical terminals and an enclosure comprising: a cup-shaped cover; a plate for closing the cover; flash directing means for forcing the majority of the flash to the outside of the enclosure when the cover is welded to the plate; and the enclosure including one or more openings for receiving the terminals and permitting the terminals to protrude from the enclosure. Preferably, the flash directing means comprises ram means for driving the flash out of the enclosure. Preferably, the flash directing means further comprises compression means for forcing the flash out of the enclosure. Preferably, the flash directing means includes a rim on the cover and a first flange formed on the plate a distance inwardly from the outer edge of the plate that is less than the thickness of the rim. Preferably, the flash directing means further includes wedge means on the plate for urging the rim of the cover towards the first flange as the cover and the plate are urged together. Preferably, the cover comprises a cup having one or more side walls extending from an enclosed bottom of the cup toward the rim, and the one or more side walls have a notch formed along the interior circumference of their distal ends to form the rim, and the first flange extends a distance from the plate that is less than the length of the rim between its proximal and distal ends. Preferably, the wedge means is located so that when the one or more walls of the cup engage the wedge means and the distal end of the rim engages the plate, the outer circumference of the rim is flush with the outer circumference of the plate. Preferably, the wedge means comprises a second flange extending from the surface of the first flange away from the plate and sloping away from the outer circumference of the plate, the first flange, the second flange and the rim forming a pocket for trapping flash as the cover is urged toward the plate. Preferably, the electrical assembly further comprises means for interfering with the larger system to ensure the formation of a vent hole in the enclosure. Preferably, the means for interfering comprises a post formed on the exterior surface of the enclosure and a hole formed in the enclosure and located so that the removal of the post exposes the hole thereby venting the enclosure. Preferably, the electrical assembly further includes means for sealing about the openings to close gaps between the terminals and the enclosure. Preferably, the means for sealing comprises a raised portion of the enclosure about the one or more openings. Preferably, the electrical assembly further includes crush bump means within the enclosure for being crushed upon the sealing of the component in the enclosure.

In another aspect the invention provides a method of manufacturing an electrical assembly intended to be a part of a larger system, such as an automobile, the method comprising the steps of: providing an electrical component having one or more electrical terminals and an enclosure comprising: a cup-shaped cover; a plate for closing the cover; flash directing means for forcing the majority of the flash to the outside of the enclosure when the cover is welded to the plate; and the enclosure including one or more openings for receiving the terminals and permitting the terminals to protrude from the enclosure; providing a nest having predetermined inside dimensions that correspond to the desired external dimensions of the cover; inserting the electrical component into the cover; placing the plate on the cover with the one or more terminals of the component passing through the one or more openings of the enclosure; and providing an ultrasonic means and ultrasonically welding the plate to the cover while pressing the cover and plate together until the cover contacts the plate. Preferably, the flash directing means includes a rim on the cover, a first flange formed on the plate a distance inwardly from the outer edge of the plate that is less than the thickness of the rim, and the step of placing comprises placing the plate on the cover with the distal end of the rim abutting the distal end of the flange. Preferably, the flash directing means further includes wedge means on the plate for urging the rim of the cover towards the first flange as the cover and the plate are urged together and the step of placing further comprises urging the rim of the cover towards the first flange as the plate is placed on the cover. Preferably, the wedge means comprises a second flange extending from the surface of the first flange away from the plate and sloping away from the outer circumference of the plate, and the step of welding and pressing further comprises forming a pocket between the second flange and the rim to trap any flash that may escape toward the interior of the cover.

The invention not only provides the many objects described above but also provides an electrical assembly and method of manufacture thereof that is relatively simple and inexpensive. Numerous other objects, advantages and features of the invention will now become apparent from the following detailed description when read in conjunction with the accompanying drawings.

BRIEF DESCRIPTION OF THE DRAWINGS

FIG. 4A shows raised portions on a plate that may be used for sealing about the openings through which the terminals pass;

FIG. 4B shows the sealing process on the plate of FIG. 4A;

FIG. 4C shows the completed seal; and

DESCRIPTION OF THE PREFERRED EMBODIMENT

Figure 1A:
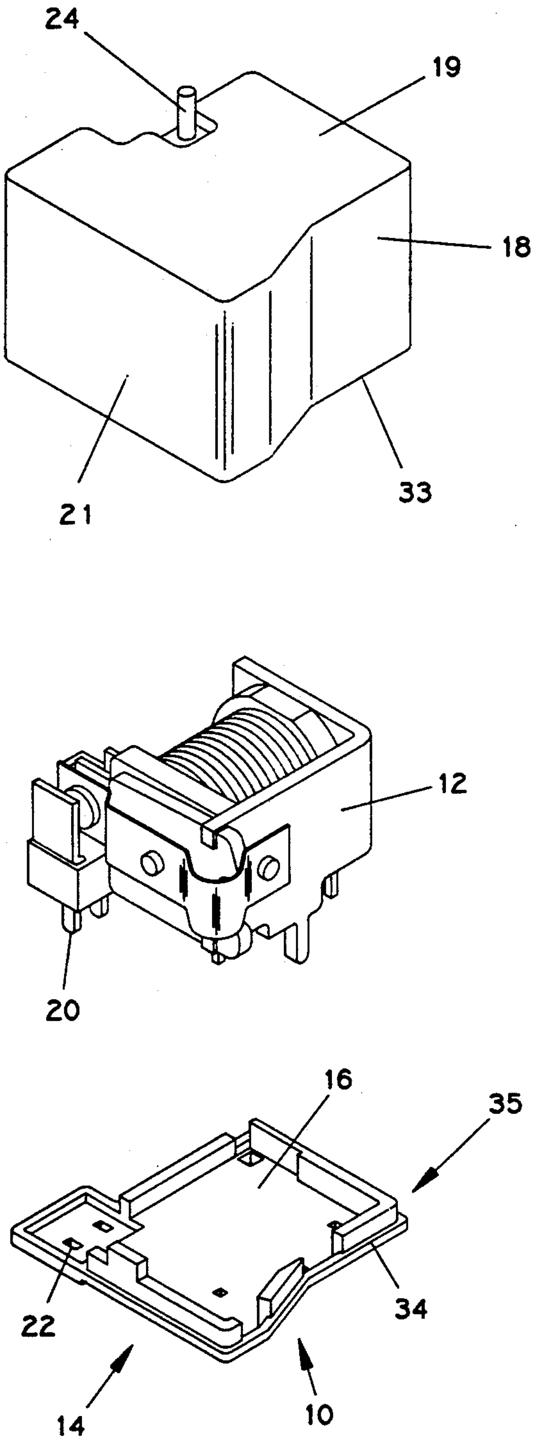
FIG. 1A is an exploded perspective view of the preferred embodiment of an electrical assembly according to the invention.
Figure 1B:
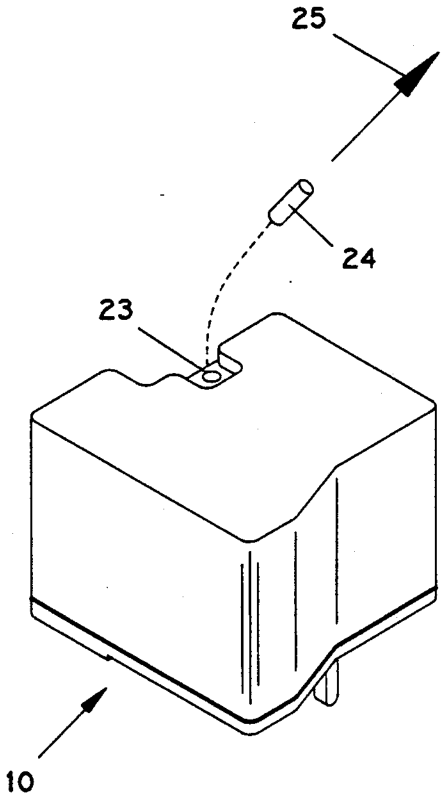
FIG. 1B shows the embodiment of FIG. 1A assembled.

Directing attention to FIG. 1A, an exploded view of the preferred embodiment of an electrical assembly according to the invention is shown. It should be understood that the particular embodiments shown herein are exemplary and are shown for purposes of illustrating the invention only, and are not intended to be limiting of the invention. Assembly 10 includes an electrical component 12 and an enclosure 14 which includes a plate 16 and a generally cup-shaped cover 18. The shape of the outer circumference 41 of plate 16 generally conforms to the shape of the outer circumference of the distal end 45 of cover 18. In the preferred embodiment the component 12 is a relay 12. Relay 12 has terminals, such as 20, which upon assembly pass through openings, such as 22, in plate 16. The assembled electrical assembly 10 is shown in FIG. 1B. After manufacture, and generally upon insertion of the assembly 10 in a larger assembly, such as the windshield wiper unit of an automobile, a post 24 is broken away from the assembly 10, as shown by the arrow 25, to vent the assembly via hole 23.

Figure 2A:
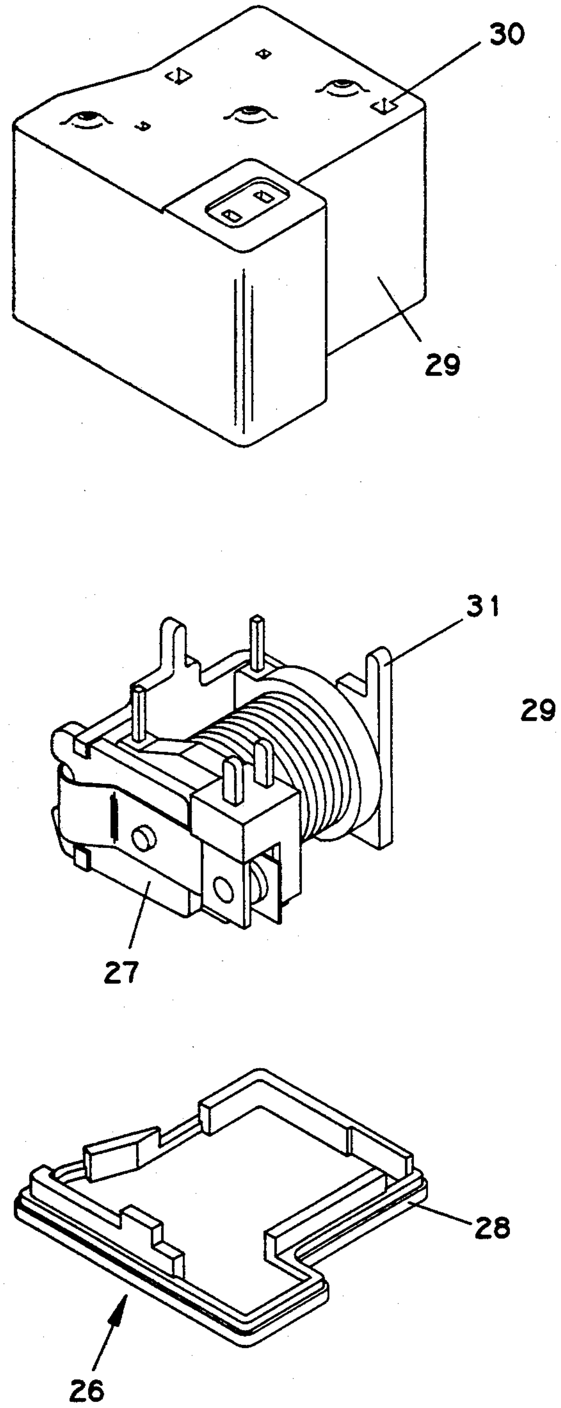
FIG. 2A shows an exploded perspective view of another embodiment of an electrical assembly according to the invention.
Figure 2B:
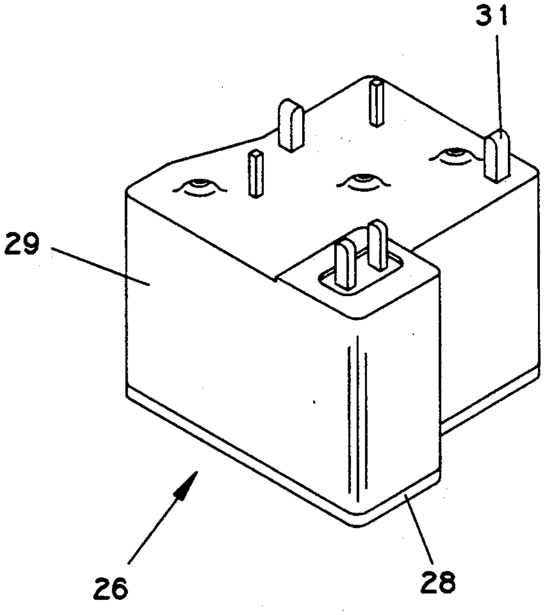
FIG. 2B shows the embodiment of FIG. 2A assembled.

FIG. 2A shows an alternative embodiment of an electrical assembly 26 according to the invention. This embodiment is similar to the embodiment just described, including an electrical relay 27, a plate 28 and a cover 29, except in this embodiment the openings, such as 30, are formed in the cover 29 and the relay 27 is flipped 180 degrees so that its terminals, such as 31 protrude through the cover 29. The assembled electrical assembly 26 is shown in FIG. 2B.

Turning now to a more detailed description of the embodiment of FIG. 1A, cover 18 includes bottom 19 and walls, such as 21. The cover could also be a hemisphere, so that the bottom and walls were all one piece. Assembly 10 includes flash directing means 32 (FIG. 3B) for forcing the majority of the flash 36 (FIG. 3C) to the outside of the assembly 10 (FIG. 1B) when the cover 18 is welded to the plate 16. Flash directing means 32 includes rim 33, first flange 34, and wedge means 35 for urging the rim 33 of the cover towards first flange 34 as the cover 18 and the plate 16 are urged together during welding. The flange 34, the rim 33, and the wedge means 35 are only generally shown in FIG. 1A. The detail of these elements is shown in expanded scale in FIGS. 3A through 3C.

Figure 3A:
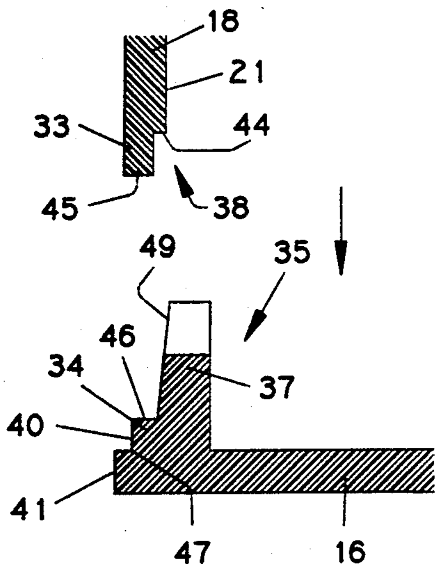
FIGS. 3A through 3C show a detail of the assembly and ultrasonic welding of the cover and plate.
Figure 3B:
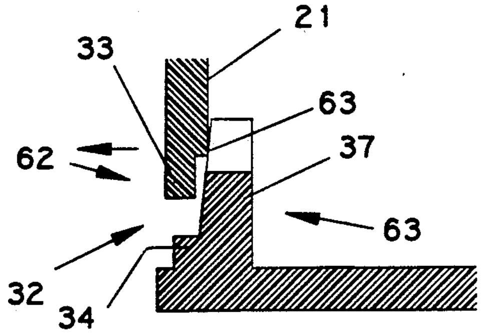
Figure 3C:
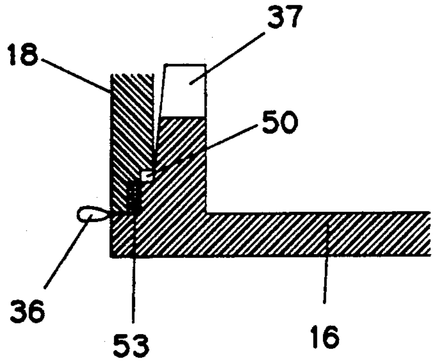
Figure 3D:
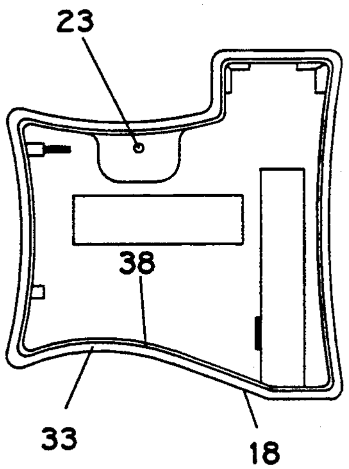
FIG. 3D shows an example of how the cover may be warped during the manufacturing process.

Turning to FIGS. 3A through 3D, wall 21 has a notch 38 formed along its interior circumference, the length of which defines rim 33. Wedge means 35 preferably comprises a second flange 37. For purposes of the discussion below, the proximal end of the wall 21 is the end toward the bottom 19 while the end terminating in rim 33 is the distal end. Likewise the proximal end 44 of the rim 33 is the end toward bottom 19, while the other end 45 is the distal end. Further, the proximal end 47 of flange 34 is the end toward plate 16, while the distal end 46 is the other end. The side 40 of first flange 34 is located a distance inwardly from the outer edge 41 of plate 16 that is less than the thickness of the rim 33. The first flange extends a distance from plate 16, i.e, the distance between ends 46 and end 47, that is less than the length of the rim between its proximal end 44 and its distal end 45. Second flange 37 extends from the end 46 of the first flange 34 and away from plate 16 and slopes away from the outer circumference 41 of plate 16, preferably at about six degrees. The relative lengths of rim 33 and first flange 34 and the location of second flange 37 forms a pocket 50 (FIG. 3C) for trapping flash as cover 18 is urged toward plate 16. Side 49 of second flange 37 is located so that when wall 21 engages side 49 and the distal end 45 of rim 33 engages plate 16, the outer circumference of rim 33 is flush with the outer circumference 41 of plate 16. FIGS. 3A through 3C show the sequence of positions of the various parts as cover 18 is welded to plate 16. In FIG. 3A the cover 18 is approaching plate 16. It is common in the case of molded plastic parts that the walls, such as 21 may warp. An exaggerated example of warpage is shown in FIG. 3D. As cover 18 nears second flange 37, the inward slope of the flange enables it to engage the inner edge of wall 21 and, if the wall is warped, urge it outward so that rim 33 is appropriately urged toward first flange 34 (FIG. 3B). As cover 18 is continued toward plate 16, end 45 of rim 33 abuts end 46 of first flange 34. The ultrasonic welder is then turned on as the cover 18 and plate 16 are pressed together. The interfering portions of rim 33 and first flange 34, shown by the cross-hatching 53 in FIG. 3C, melt and fuse with the extra material, the flash 36, being forced out the opening between the ends 45 and 46 until the ends meet. There are three elements that combine to force the flash 36 out of the enclosure. First, rim 33 acts like a ram means 62 (FIG. 3B) to drive the flash out of the chamber. Secondly, the wall 21 is relatively malleable under the ultrasonic energy, thus the point of contact 63 of the wall 21 and second flange 37 forms a seal and as wall 21 is driven downward it compresses the air in front of it. Further, the pocket 50 becomes smaller as the wall 21 is driven forward both due to the ablation of rim 33 and the fact that flange 37 slopes toward it. This further compresses the air in the pocket 50. Thus the wall 21 and rim 33 surfaces in the area of notch 38 act as a compression means 65 for driving the flash out of the enclosure. Thirdly, the rim 33 is moving downward in FIGS. 3A and 3B, thus the material out of which it is composed has inertia. As this material melts and becomes fluid, it retains the inertia and tends to flow out of the enclosure 14 as the rim 33 and wall 21 near their stopping point and begin to slow down. Thus, all or nearly all of the flash will be forced out of the enclosure 14. Any flash that may escape toward the interior of cover 18 is trapped in pocket 50.

FIGS. 4A through 4C show an optional feature of the invention. In this embodiment raised areas, such as 54, are formed about openings, such as 55, on plate 56. For simplicity the various flanges are not show. After the terminals, such as 58, are pressed through the openings, such as 55, a tool 59 is slipped over the end of the terminal and pressed against the raised area 54 to deform the raised material and close any gaps, such as 60, between the terminal and the plate 56, as shown in a detail in FIG. 4B. Preferably the tool 59 is heated to increase its ability to displace the raised material 54. The sealed plate 56 and terminal 58 are shown in a detail in FIG. 4C. Optionally, epoxy or other sealer may be used around terminals to ensure that an hermetic seal is produced.

Figure 5:
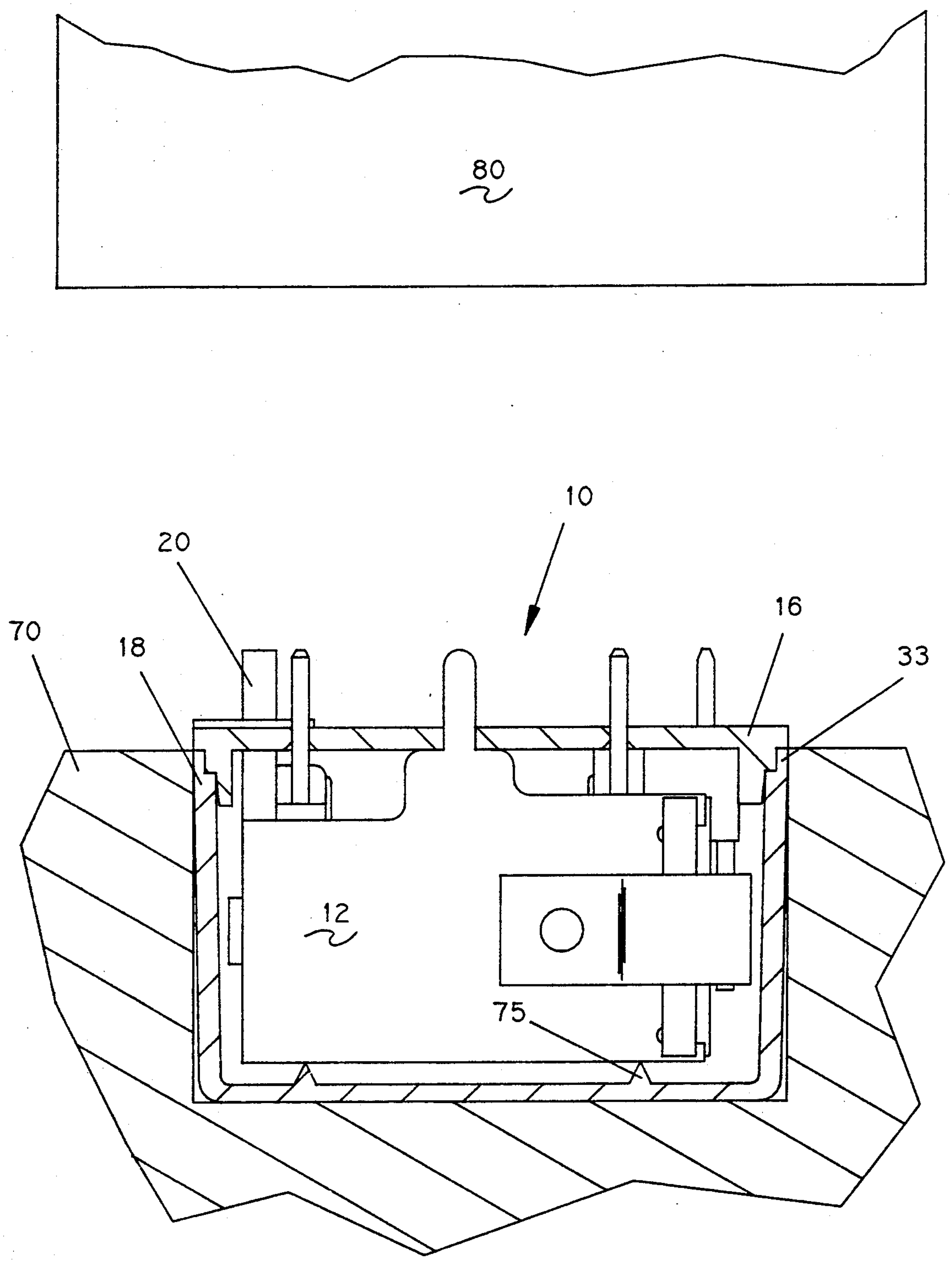
FIG. 5 shows a cross-section of the assembly of FIG. 1B in a nest during the ultrasonic welding process.

Referring to FIG. 5, the electrical assembly 10 according to the invention is manufactured by placing the cover 18, relay 12, and plate 16 in a nest 70 having predetermined inside dimensions that correspond to the desired external dimensions of the finished device. Raised ridges, such as 75, within cover 18 provide an interference fit between the relay 12 and the cover 18 and plate 16. These ridges, such as 75 are termed "crush bumps". An ultrasonic horn 80 is then placed in position and the plate 16 is pressed into place while the sonic energy is applied. The crush bumps, such as 75, are crushed to provide the interference fit, compensating for variations within tolerance, and ensuring a tight internal assembly of relay 12 between cover 18 and plate 16. Using the nest prevents the expansion of the weld area in the outward direction as the ultrasonic energy is being provided.

In the preferred embodiment the cover 18 and plate are made of PET polyester, although any suitable ultrasonically weldable plastic or other material may be used.

The enclosure according to the invention protects the relay 12 from mechanical damage or foreign substances, such as conformal coatings or other chemicals used during later manufacturing processes. After these other manufacturing processes are completed, it is generally desirable to vent the enclosure 10 so that gases produced during operation of the relay may be vented, and so that pressures produced by changing temperatures may be vented. Such venting is provided by a hole 23 formed in cover 18 (FIGS. 1A and 1B) and a post 24 that is molded over the hole. Post 24 preferably extends a short distance beyond the bottom 19 of cover 18 It is dimensioned so that it will mechanically interfere with other parts of the larger system of which the assembly 10 is designed to be a part. For example, the embodiment shown in FIGS. 1A and 1B is designed to be part of a windshield wiper mechanism in an automobile. The post 24 will interfere with the wiper housing so that it is either broken off when the housing is assembled or the assembly 10 will not properly fit in the housing. This insures that the post is not accidentally left in place. Removal of the post as shown in FIG. 1B exposes the hole 23 and vents the enclosure 14.

The assembly 10 according to the invention provides for protecting the electrical component 12 during manufacture and also ensures that flash and dirt will not interfere with the internal workings of the electrical component afterwards. It provides a component of high reliability and long life.

A novel electrical assembly that provides numerous features and advantages has been described. It is evident that those skilled in the art may now make many changes in the embodiments described without departing from the inventive concepts. For example, different dimensions or relative placements of the various parts may be used. Equivalent parts or materials may be used.

What is claimed is:

1. An electrical assembly intended to be a part of a larger system, such as an automobile, said assembly comprising an electrical component having one or more electrical terminals, carried in an enclosure, said enclosure comprising:

a cup-shaped cover;

a plate closing said cover;

flash directing means carried by said cover for forcing the majority of the flash to the outside of said enclosure when said cover is welded to said plate; and said enclosure including one or more openings for receiving said terminals and permitting said terminals to protrude from said enclosure.

2. An electrical assembly as in claim 1 wherein said flash directing means carried by said cover comprises ram means for driving the flash out of said enclosure.

3. An electrical assembly as in claim 1 wherein said flash directing means carried by said cover comprises compression means for forcing the flash out of said enclosure.

4. An electrical assembly as in claim 1 wherein said flash directing means includes a rim on said cover and a first flange formed on said plate a distance inwardly from the outer edge of said plate that is less than the thickness of said rim.

5. An electrical assembly as in claim 4 wherein said flash directing means further includes wedge means on said plate for urging said rim of said cover towards said first flange as said cover and said plate are urged together.

6. An electrical assembly as in claim 5 wherein said cover comprises a cup having one or more side walls extending from an enclosed bottom of said cup toward said rim, and wherein said one or more side walls have a notch formed along the interior circumference of their distal ends to form said rim, said first flange further extending a distance from said plate that is less than the length of said rim between its proximal and distal ends.

7. An electrical assembly as in claim 6 wherein said wedge means is located so that when said one or more walls of said cup engage said wedge means and the distal end of said rim engages said plate, the outer circumference of said rim is flush with the outer circumference of said plate.

8. An electrical assembly as in claim 5 wherein said wedge means comprises a second flange extending from the surface of the first flange away from the plate and sloping away from the outer circumference of the plate, said first flange, said second flange and said rim forming a pocket for trapping flash as said cover is urged toward said plate.

9. An electrical assembly as in claim 1 and further comprising means for interfering with said larger system to ensure the formation of a vent hole in said enclosure.

10. An electrical assembly as in claim 9 wherein said means for interfering comprises a post formed on the exterior surface of said enclosure and a hole formed in said enclosure and located so that the removal of said post exposes said hole thereby venting said enclosure.

11. An electrical assembly as in claim 1 and further including means for sealing about said openings to close gaps between said terminals and said enclosure.

12. An electrical assembly as in claim 11 wherein said means for sealing comprises a raised portion of said enclosure about said one or more openings.

13. An electrical assembly as in claim 1 and further including crush bump means within said enclosure for being crushed upon the sealing of said component in said enclosure.

14. An electrical assembly as in claim 13 wherein said cover comprises a cup having a bottom and one or more sides and said crush bump means comprises one or more ridges formed on the interior surface of said cup bottom.

15. A method of manufacturing an electrical assembly intended to be a part of a larger system, such as an automobile, said method comprising the steps of:

providing an electrical component having one or more electrical terminals and an enclosure comprising: a cup-shaped cover; a plate for closing said cover; flash directing means for forcing the majority of the flash to the outside of said enclosure when said cover is welded to said plate; and said enclosure including one or more openings for receiving said terminals and permitting said terminals to protrude from said enclosure;

proving a nest having predetermined inside dimensions that correspond to the desired external dimensions of said cover;

inserting said cover into said nest;

inserting said electrical component into said cover;

placing said plate on said cover with said one or more terminals of said component passing through said one or more openings of said enclosure; and providing an ultrasonic horn and ultrasonically welding said plate to said cover while pressing said cover and plate together until said cover contacts said plate.

16. A method of manufacturing as in claim 15 wherein said flash directing means includes a rim on said cover and a first flange formed on said plate a distance inwardly from the outer edge of said plate that is less than the thickness of said rim, and wherein said step of placing comprises placing said plate on said cover with the distal end of said rim abutting the distal end of said first flange.

17. A method of manufacturing as in claim 16 wherein said flash directing means further includes wedge means on said plate for urging said rim of said cover towards said first flange as said cover and said plate are urged together and said step of placing further comprises urging said rim of said cover towards said first flange as said plate is placed on said cover.

18. A method of manufacturing as in claim 17 wherein said wedge means comprises a second flange extending from the surface of the first flange away from the plate and sloping away from the outer circumference of the plate, and said step of welding and pressing further comprises forming a pocket between said second flange and said rim to trap any flash that may escape toward the interior of said cover.

* * * * *